United States Patent [19]

Akama et al.

[11] 4,170,481

[45] Oct. 9, 1979

[54] PHOTOSENSITIVE POLYMER COMPOSITION

[75] Inventors: Tadashi Akama, Okazaki; Kuniyuki Sakai, Otsu, both of Japan

[73] Assignee: Toray Industries, Inc., Tokyo, Japan

[21] Appl. No.: 848,938

[22] Filed: Nov. 7, 1977

[30] Foreign Application Priority Data

Nov. 8, 1976 [JP] Japan .................................. 51-133265

[51] Int. Cl.$^2$ .......................... G03C 1/68; C08K 5/00; C08L 5/00
[52] U.S. Cl. ................................ 96/115 P; 96/115 R; 260/45.8 A; 526/84
[58] Field of Search ......................... 96/115 R, 115 P; 260/45.8 A; 526/84

[56] References Cited

U.S. PATENT DOCUMENTS

B. 437,894   2/1976   Barzynski et al. ................ 96/115 R
3,615,629   10/1971   Wilhelm et al. ................... 96/115 R

*Primary Examiner*—Richard L. Schilling
*Attorney, Agent, or Firm*—Miller & Prestia

[57] ABSTRACT

A photosensitive polymer composition comprising
(1) either a
   (a) soluble polymer and photopolymerizable ethylenically unsaturated compound or
   (b) soluble polymer having photopolymerizable ethylenically unsaturated groups in the polymer chain, and
(2) about 0.001 to 10 parts, by weight, of ascorbic acids and/or their derivatives to about 100 parts, by weight, of 1(a) or 1(b).

12 Claims, No Drawings

PHOTOSENSITIVE POLYMER COMPOSITION

This invention relates to a photosensitive polymer composition having excellent stability when exposed to heat and/or stored for long periods of time.

Heretofore, photosensitive polymer compositions have been comprised of a soluble polymer and photopolymerizable unsaturated compounds or a soluble polymer having photopolymerizable unsaturated groups. Such compositions have been used for printing plates, photoresists, photocurable paints, adhesives, image forming materials, etc. Usually in such compositions, photosensitizers and/or photoinitiators have been added.

Preparation of such compositions includes processes such as dissolving, mixing, drying and sheet-forming, which processes are carried out at high temperatures. Also the sheets and films thus prepared are often stored for long periods of time under various conditions. It is required that heat polymerization be completely inhibited during preparation and storage. On the other hand, it is also required that when such compositions are exposed to actinic radiation the polymerization step must proceed rapidly.

The following compounds have been recommended as inhibitors suitable for photosensitive polymer compositions in prior art compositions:

(1) hydroquinone, hydroquinone monomethyl ether, p-tertiarybutylcatechol and such phenolic compounds;
(2) benzoquinone, chloranil and such quinones;
(3) phenothiazine, methylene blue and their derivatives;
(4) amine compounds such as β-napthylamine;
(5) nitro compounds;
(6) cuprous compounds;
(7) derivatives of N-nitrosohydroxylamines;
(8) phosphoric compounds.

Such compounds as cited above are effective to inhibit radical polymerizations whether the polymerization is induced by heat or light. To obtain sufficient inhibition of heat polymerization, however, large amounts of such compounds need to be added to the compositions. Thus, the photopolymerization process is retarded by the presence of these compounds and the photosensitivity is markedly reduced. When methylene blue or aromatic amines are used the compositions become colored and the transparency to actinic radiation decreases; resulting in reduction of the photosensitivity of the compositions.

An object of this invention is to provide a new composition with improved stability when exposed to heat during preparation and stored for long periods of time while maintaining a high degree of photosensitivity. This invention is based on the fact that a photopolymerizable composition consisting of (A) a soluble polymer and photopolymerizable ethylenically unsaturated compounds or (B) a soluble polymer having photopolymerizable ethylenically unsaturated groups in the polymer chain and about 0.001 to 10 parts, by weight, of ascorbic acid and/or derivatives thereof, to about 100 parts, by weight, of photohardenable compositions of (A) or (B) has excellent heat-stability and photosensitivity.

Soluble polymers suitable for the above compositions (A) or (B) are as follows:

(1) Soluble polyamides which may be prepared by copolymerization reactions of some dibasic acids having 2 to 12 carbon atoms with some diamines having 1 to 16 carbon atoms. Preferred dibasic acids are adipic acid, sebacic acid, azeleic acid and diglycolic acid. Preferred diamines are trimethylene diamine, trimethylhexamethylene diamine and 4,4'-diaminocyclohexylmethane. ω-aminoacids, lactams or their derivatives having 1 to 12 carbon atoms may be used as monomers for copolymerization. Unsaturated polyamides having unsaturated groups in the polymer chain or in the side chain may be also used in this invention.

(2) organic soluble or base-soluble cellulose derivatives;

(3) polyvinyl alcohols and their derivatives;

(4) polyesters prepared by saturated and/or unsaturated dibasic carboxylic acids and glycols;

(5) polyalkylene oxides having a molecular weight from about 4000 to over 1,000,000;

(6) synthetic elastomers such as NBR, SBR, polybutadienes, etc.;

(7) a mixture of the polymers above cited.

Photopolymerizable compounds having more than two ethylenically unsaturated groups in the molecule which may be used with the soluble polymers above cited, are as follows:

(1) acrylates or methacrylates of polyols such as glycols, methylolpropane, pentaerythritol or polyethers having more than two hydroxyl groups (for example, triethylene glycol dimethacrylate, polyethers with branching methacryloxymethyl groups which are obtained in the polymerization of glycidyl methacrylate, pentaerythritol triacrylate, etc.);

(2) multi-valent metallic salts of acrylic and methacrylic acids;

(3) unsaturated compounds obtained by addition reactions of glycidyl methacrylate and reagents having active hydrogens (for example, a methacrylate having the chemical structure:

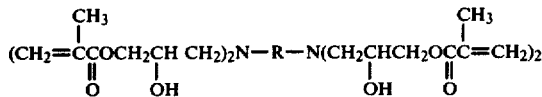

(where R is a member of the group consisting of alkylene, xylylene, cyclohexylene, phenylene, etc.);

(4) bisacrylamides and bismethacrylamides derived from diamino compounds (for example, N,N'-methylenebisacrylamide, N,N'-m-phenylenebisacrylamide, ethylene glycol bisacryloyl aminomethyl ether, N,N'-hexamethylene bis-acrylamide, etc.);

(5) reaction products of glycidyl ethers of multi-functional alcohols and acrylic acid or methacrylic acid, for example, the methacrylates:

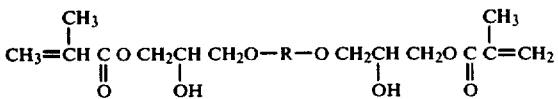

(where R is a polyalkylene glycol residue derived from glycols having 2 to 5 carbon atoms, for example, ethylene glycol, diethylene glycol, propylene glycol, dipropylene glycol, etc. In addition to the compounds having more than two ethylenically unsaturated groups in the molecule, the following compounds having monofunctional unsaturated groups may also be used in the practice of this invention:

(1) acrylamide, methacrylamide and their derivatives such as N-methylolacrylamide, N-methylolacrylamide butyl ether, diacetone acrylamide, etc.;

(2) glycidyl acrylate and methacrylate;

(3) hydroxylalkyl acrylate and methacrylate, with or without halogen radicals, for example 3-chloro-2-hydroxypropyl methacrylate, etc.

A very important factor in providing a combination of soluble polymers and photopolymerizable ethylenically unsaturated compounds is compatibility. If the components are not compatible, the composition will have poor photosensitivity and furthermore the photopolymerizable components will migrate out or educe out from the composition if stored for long periods of time. In the case of a composition consisting of a soluble polyamide, for example, large quantities of trimethylene glycol dimethacrylate or methylenebisacrylamide should not be added to the composition because of poor compatibility. On the other hand, soluble polyamides and the photopolymerizable methacrylates cited in (3) and (5) give good photosensitive compositions because the migration of the photopolymerizable components does not occur during storage even under conditions of high temperatures and high humidity. Another type of photohardenable composition which is used in this invention is a photopolymerizable polymer having ethylenically unsaturated groups in the molecules. Some examples are as follows:

(1) unsaturated polyamides which are obtained from a reaction of N-methylol or N-alkoxy methylpolyamide and acrylic acid or methacrylic acid;

(2) reaction products obtained from N-methylolacrylamide and polyamides in the presence of acidic catalyst;

(3) reaction products obtained from glycidyl acrylate or methacrylate and polyamides;

(4) reaction products obtained from glycidyl acrylate or methacrylate copolymers and acrylic acid or methacrylic acid;

(5) polyesters containing terminal and/or branching double bonds;

(6) polyurethane rubbers containing terminal and/or branching double bonds.

The photopolymerizable polymers above cited preferably have more than two ethylenically unsaturated groups in the molecules. The compositions consisting of the polymers above described may also contain soluble polymers and/or photopolymerizable ethylenically unsaturated compounds as previously cited.

The concentrations of the ethylenically unsaturated groups which are required in the photohardenable compositions depend on the kind of components to be used and the proposed use of the composition. In the case of printing plates, for instance, letter set printing plates require hard and sharp reliefs, and so a high concentration of ethylenically unsaturated groups usually gives good results. On the contrary, flexographic printing plates in the field of corrugated card box printing should have soft and flexible reliefs. Accordingly the composition should be designed so that the concentration of ethylenically unsaturated groups is rather low. In general, 1 mole equivalent of ethylenically unsaturated groups is required in about 100 to 100,000 grams of the photohardenable composition.

Specific examples of ascorbic acids and their derivatives added to the photohardenable composition according to this invention to improve heat-stability include L-ascorbic acid, D-isoascorbic acid, L-ascorbyl monostearate, sodium L-ascorbate, sodium D-isoascorbate, etc. All of the foregoing compounds are intended to be included within the term "The ascorbic acids and their derivatives" as referred to in this specification and in the appended claims.

The amount of these ascorbic acids and their derivatives must be sufficient to stabilize the photohardenable compositions to heat and storage. This amount is generally about 0.001 to 10 parts, by weight, preferably about 0.01 to 1 part, by weight, to about 100 parts by weight, of the photohardenable composition. Less than about 0.001 part, by weight, of the ascorbic acid or its derivative does not sufficiently improve heat stability. On the other hand, even if more than about 10 parts, by weight, to about 100 parts, by weight, of the composition is added, the heat-stability will not be improved further, and rather, some defects, such as decreased photosensitivity have been found to appear.

In comparison with known inhibitors of the prior art, large amounts of the ascorbic acid or its derivative can be added to the composition without detrimental effect to photosensitivity.

It is suggested that this highly desirable effect is due to the properties of the ascorbic acids and their derivatives in that they may be wholly or partially decomposed by exposure to actinic radiation to lose the effect of inhibiting photopolymerization.

The photosensitive composition of this invention may contain a photosensitizer or a photoinitiator to exhibit high photosensitivity, the proper amount of which is about 0.01 to 10 parts, by weight, to about 100 parts, by weight, of the photohardenable composition. If the amount is less than about 0.001 parts, by weight, the photosensitivity of the composition is found to be poor. If this amount is more than about 10 parts, by weight, the desired deep reliefs will not be obtained because the absorption of actinic radiation at the surface layer of the composition becomes so great that actinic radiation cannot reach the bottom portion of the photosensitive layer.

Various kinds of photosensitizers and photoinitiators are well known in the field of photopolymerization techniques. Examples include: benzophenone and its derivatives, benzoin and its derivatives, anthraquinone and its derivatives, uranyl compounds, sulfur compounds, halogenide compounds, etc.

Compounds having benzoyl radicals are generally more useful. Especially useful are benzoin alkyl ethers. So far as we are aware, α-alkyl benzoin alkyl ethers are the most effective ones. But, unfortunately it is well known that these benzoin derivatives are unstable at high temperatures, and that compositions containing them often become insoluble by heat polymerization in the dark either during preparation or during storage. According to this invention, when ascorbic acids and/or their derivatives are added, the photosensitive compositions, which contain benzoin alkyl ethers as photoinitiators become much more stable during heating and storing.

The photosensitive compositions of this invention may also contain: activators to promote the photosensitivity including tertiary amines such as triethanol amine, phosphorus compounds such as triphenylphosphine, etc.; heat stabilizers; plasticizers; compounds to improve the compatibility of the components; dyes and colorants, and other photopolymerizable monomers not described above.

Ascorbic acids and their derivatives should prevent heat polymerization, but if necessary, some other inhibitors may also be added to the compositions. Examples of those inhibitors are: hydroquinone and its derivatives, phenolic compounds, quinones, aromatic nitro compounds, aromatic amines, phenothiazine, and phosphorus compounds. Mercaptans such as butylmercaptan and laurylmercaptan are also useful as heat stabilizers. The most effective mercaptan of which we are aware is α-thioglycerine.

The amount of the inhibitor is usually about 0.001 to 1 part, by weight, of the photosensitive compounds. Two or more kinds of inhibitors may be combined.

In preparing the photosensitive composition, the components may be mixed at high temperatures either in a solvent or in bulk. If the components have poor heat stability, the composition will finally become insoluble after undergoing an increase in viscosity. Even in the case where no viscosity increase is observed, the solution of the composition does often become turbid. Such turbidity may be detected more easily when the solution is further diluted with a proper solvent. Even if the amount of turbidity is very small, the scattering of the actinic radiation at the surface and in the layer of the photosensitive composition increases, and transparency is reduced. Therefore, in the case of a printing plate, such turbidity causes many problems, so that the depths of the reliefs and dots become shallow and isolated reliefs are side-etched and consequently broken off during processing or printing.

Such turbidity cannot be avoided by the addition of the ordinary inhibitors cited above. The present invention makes it possible to provide a method for preventing turbidity in the photosensitive compositions. That is, the combination of the ascorbic acid and/or its derivative and the aromatic compound having a phenolic hydroxyl group or groups coacts to provide a photosensitive composition without turbidity occurring.

The aromatic compounds having a hydroxyl group or groups, which exhibit a synergistic effect with ascorbic acids and/or their derivatives are as follows: hydroquinone, hydroquinone monomethyl ether, 2,5-di-tertiary-butylcresol, 2,5-di-tertiary-butylhydroquinone, tertiary-butylcatechol, etc.

Photosensitive compounds of this invention can be used for printing plates (letter press and offset press), photoresists, photocurable paints, image-forming materials, etc.

The photosensitive compositions including ascorbic acids and/or their derivatives are much more stable during heating than are other known photosensitve polymer compositions, as shown in the examples. This excellent heat stability makes it possible to mold the compositions at high temperatures and to store them for long periods of time without polymerization occurring.

When used for a printing plate, the photosensitive composition is formed into a layer by usual methods, such as pressing and calendering, on an appropriate base such as a steel plate and a plastic film. An adhesive layer may be inserted between the photosensitive layer and the base. A printing plate can also be prepared by coating the base with a solution of the composition and evaporating the solvent.

Reliefs or image patterns using the photosensitive composition or layer are created by exposure to actinic radiation through a negative film and washing the unexposed area with an appropriate solvent. Exposure time, washing time and type of solvent used depend on the components of the photosensitive compositions.

Some practical examples of this invention are as follows. They are not intended to limit the scope of the invention, which is defined in the appended claims.

EXAMPLE 1

55 parts, by weight, of "Ultramid 1C," a trade name of BASF Company (a copolyamide of ε-caprolactam, hexamethylenediammonium adipate and 4,4'-diaminocyclohexylmethane adipate, which is soluble in alcohol) was dissolved in 300 parts, by weight, of ethyl alcohol, and 40 parts, by weight, of the reaction product of 1 mole of ethylene glycohol diglycidyl ether and 2 moles of methacrylic acid, 3 parts, by weight, of diethylene glycol, 1.5 parts, by weight, of benzoin isopropyl ether and 0.2 parts, by weight, of triphenylphosphine were added to the solution and the solution was stirred at 80° C. (I). Another solution (II) with the inclusion of 0.05 parts, by weight, of L-ascorbic acid was also prepared and stirred at 80° C.

After 16 hours the solution (I) became highly viscous and finally stirring became impossible. Solution (II), however, containing L-ascorbic acid, could be stirred for 24 hours without any increase in viscosity.

EXAMPLE 2

55 parts, by weight, of the alcohol soluble polyamide (same as that in Example 1) was dissolved in 300 parts, by weight, of ethyl alcohol, and 40 parts, by weight, of the reaction product of Example 1; 3 parts, by weight, of triethanolamine; 1 part, by weight, of triphenylphosphine; 1 part, by weight, of benzoin methyl ether; 0.5 parts, by weight, of thioglycerine and and 0.03 parts, by weight, of L-ascorbic acid were added to the solution and stirred at 80° C. under a nitrogen atmosphere. No increase in viscosity of the solution was detected after 24 hours.

EXAMPLE 3

55 parts, by weight, of an alcohol soluble polyamide (a copolyamide of ε-caprolactam, hexamethylenediammonium adipate and trimethylhexamethylenediammonium adipate) was dissolved in 300 parts, by weight, of ethyl alcohol, and 25 parts, by weight, of the reaction product of 1 mole of m-xylylenediamine and 4 moles of glycidyl methacrylate; 10 parts, by weight, of 3-chloro-2-hydroxylpropyl methacrylate; 5 parts, by weight, of acrylamide; 3 parts, by weight, diethylene glycol; 0.5 parts, by weight, of triphenylphosphine; 1.5 parts, by weight, of benzoin isopropyl ether, and 0.03 parts, by weight, of L-ascorbic acid, D-isoascorbic acid and L-ascorbyl stearate, respectively, were added to the solution; and stirred at 80° C. under a nitrogen atmosphere for 24 hours. No increase in the viscosity of the solution was detected.

EXAMPLE 4

About 0.001 to 0.1 part, by weight, each of L-ascorbic acid and hydroquinone were added to the solution of Example 2, and stirred at 80° C. The solution did not become turbid after 24 hours. However, solutions to which L-ascorbic acid alone or hydroquinone alone was added became somewhat turbid after 2–3 hours while stirring at 80° C.

EXAMPLE 5

To the solutions consisting of the components of Example 2, benzoin isopropyl ether was added instead of benzoin methyl ether as a photoinitiator, and either L-ascorbic acid or hydroquinone was added as an inhibitor. The solutions were cast on thin steel plates surface-coated with adhesives. Photosensitive printing plates with photosensitive layers 740 μm thick were prepared after drying at 50° C. for 16 hours and laminating polyester films on the surfaces of the layers which were coated with ethyl alcohol/water (80/20, by weight).

A 21-step sensitivity guide (Stauffer Graphic Arts Equipment Co.) was placed in tight contact with the surface of the photosensitive layer and was exposed for 2 minutes to a 2 KW super-high pressure mercury lamp at a distance of 65 cm. The unexposed area of the photosensitive layer was washed with ethyl alcohol/water (80/20, by weight) using spray-type wash equipment. The photosensitive layers were insolubilized to sensitivity guide numbers to determine the photosensitivity. The photosensitive plates covered with polyester films were kept in an oven at 50° C., and were checked regularly for solubility in ethyl alcohol/water (80/20, by weight) to determine heat stability. The results are listed in Table 1.

TABLE 1

| Parts by Weight | L-Ascorbic Acid | | Hydroquinone | |
| --- | --- | --- | --- | --- |
| | Photo-Sensitivity | Heat Stability day(s) | Photo-Sensitivity | Heat Stability day(s) |
| 0 | 18.8 | 1 | 18.8 | 1 |
| 0.01 | 18.7 | 5 | 18.7 | 5 |
| 0.02 | 18.7 | 7 | 17.2 | 6 |
| 0.03 | 18.4 | 7 | 16.4 | 7 |
| 0.05 | 18.0 | 9 | 15.2 | 8 |
| 0.1 | 17.8 | 10 | 13.6 | 10 |

EXAMPLE 6

47 parts, by weight, of a partially hydrolyzed polyvinyl alcohol (degree of hydrolysis 85%, average degree of polymerization 2,000); 2 parts, by weight, of benzoin methyl ether; 1 part, by weight, of triphenylphosphine and 0.05 parts, by weight, of L-ascorbic acid were dissolved in water/ethyl alcohol (50/50, by weight).

The solution was cast on a steel plate coated with an adhesive layer. A photosensitive layer was prepared after drying at 50° C. for 16 hours and laminating a polyester film on the surface of the layer which was coated with water/ethyl alcohol (50/50, by weight).

The plate was kept in an oven at 50° C. and the photosensitive layer became insoluble after 7 days. However, the photosensitive layer without L-ascorbic acid became insoluble after only 1 day at 50° C.

It will be appreciated that although certain specific forms of the invention have been referred to as examples herein, equivalents may be substituted therefor and that certain features may be used independently of other features, all without departing from the spirit and scope of the invention as defined in the appended claims.

The following is claimed:

1. A photosensitive polymer composition comprising:
   (1) a photohardenable composition comprising a soluble polymer selected from the group consisting of:
      (a) a soluble polymer and photopolymerizable ethylenically unsaturated compound(s), or
      (b) a soluble polymer having photopolymerizable ethylenically unsaturated groups in the polymer chain, and
   (2) about 0.001 to 10 parts, by weight, per 100 parts, by weight, of (1)(a) or (1)(b) of a member selected from the group consisting of the ascorbic acids and their derivatives, said member comprising either an ascorbic acid, ascorbic acid ester, or ascorbic acid salt moiety and being adapted to provide stability to heat and storage for said photohardenable composition of (1)(a) or (1)(b).

2. The photosensitive polymer composition of claim 1, wherein said member (2) comprises a member selected from the group consisting of L-ascorbic acid, D-isoascorbic acid, L-ascorbyl monostearate, sodium L-ascorbate and sodium D-isoascorbate.

3. The photosensitive polymer composition of claim 1, which further comprises about 0.01 to 10 parts, by weight, of a photosensitizer or photoinitiator to 100 parts, by weight, of the photohardenable composition.

4. The photosensitive polymer composition of claim 3, wherein said photoinitiator is benzoin alkyl ether.

5. The photosensitive polymer composition of claim 1, further containing about 0.001 to 1 part, by weight, of an inhibitor based on 100 parts, by weight, of the photohardenable composition.

6. The photosensitive polymer composition of claim 5, wherein said inhibitor is selected from the group consisting of phenolic compounds, quinones, aromatic nitro compounds, aromatic amines, mercaptans, phenothiazine and phosphorus compounds.

7. The photosensitive polymer composition of claim 6 wherein said inhibitor is a phenolic compound.

8. The photosensitive polymer composition of claim 7, wherein said phenolic compound is selected from the group consisting of hydroquinone, hydroquinone monomethyl ether, 2,5-di-tertiary-butyl cresol, 2,5-di-tertiary-butyl hydroquinone, and tertiary-butyl catechol.

9. The photosensitive polymer composition of claim 6, wherein said inhibitor is α-thioglycerine.

10. A photosensitive polymer composition comprising:
   (1) a soluble polyamide prepared by copolymerization reaction of a dibasic acid having 2 to 12 carbon atoms with a diamine having 1 to 16 carbon atoms,
   (2) a photopolymerizable ethylenically unsaturated compound, and
   (3) about 0.001 to 10 parts, by weight, per 100 parts by weight of (1) and (2) of a member selected from the group consisting of the ascorbic acids and their derivatives, said member (3) comprising either an ascorbic acid, ascorbic acid ester, or ascorbic acid salt moiety and being adapted to provide stability to heat and storage for said polyamide (1) and and compound (2).

11. The photosensitive polymer composition of claim 10 wherein said photopolymerizable ethylenically unsaturated compound (2) is a member selected from the group consisting of the following compounds:

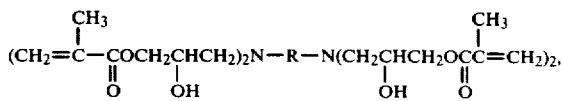

wherein R is alkylene, xylylene, cyclohexylene, or phenylene; and

wherein R' is a polyalkylene glycol residue derived from glycol having 2 to 5 carbon atoms.

12. A photosensitive polymer composition comprising:

(1) a soluble polymer selected from the group consisting of:
  (a) a soluble polymer and photopolymerizable ethylenically unsaturated compound(s), or
  (b) a soluble polymer having photopolymerizable ethylenically unsaturated groups in the polymer chain, and (2) about 0.001–10 parts, by weight, per 100 parts by weight of (1)(a) or (1)(b), of a member selected from the group consisting of L-ascorbic acid, D-isoascorbic acid, L-ascorbyl monostearate, sodium L-ascorbate and sodium D-isoascorbate.

* * * * *